US009135391B2

(12) United States Patent
Gibson et al.

(10) Patent No.: US 9,135,391 B2
(45) Date of Patent: Sep. 15, 2015

(54) DETERMINATION OF ELECTROMIGRATION SUSCEPTIBILITY BASED ON HYDROSTATIC STRESS ANALYSIS

(71) Applicant: Mentor Graphics Corporation, Wilsonville, OR (US)

(72) Inventors: Patrick Gibson, Tualatin, OR (US); Valeriy Sukharev, Campbell, CA (US); William Matthew Hogan, Lake Oswego, OR (US); Sridhar Srinivasan, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/090,294

(22) Filed: Nov. 26, 2013

(65) Prior Publication Data
US 2015/0143318 A1 May 21, 2015

Related U.S. Application Data

(63) Continuation-in-part of application No. 14/085,788, filed on Nov. 20, 2013.

(51) Int. Cl.
*G06F 17/50* (2006.01)
(52) U.S. Cl.
CPC ........ *G06F 17/5081* (2013.01); *G06F 17/5077* (2013.01)
(58) Field of Classification Search
CPC .................. G06F 17/5081; G06F 17/5077
See application file for complete search history.

(56) References Cited

U.S. PATENT DOCUMENTS

| 8,510,695 | B1* | 8/2013 | Demircan et al. | 716/112 |
|---|---|---|---|---|
| 8,656,325 | B2* | 2/2014 | Barwin et al. | 716/100 |
| 8,694,945 | B2* | 4/2014 | Wang et al. | 716/126 |
| 8,793,632 | B2* | 7/2014 | Demircan et al. | 716/112 |
| 2004/0111244 | A1* | 6/2004 | Sukharev et al. | 703/6 |
| 2011/0254168 | A1* | 10/2011 | Ding et al. | 257/774 |
| 2013/0148406 | A1* | 6/2013 | Shimakawa et al. | 365/148 |
| 2014/0109030 | A1* | 4/2014 | Lee et al. | 716/115 |

OTHER PUBLICATIONS

Yucheng Wang ; Overhauser, D. ; Basel, M. ,"Accurate parasitic resistance extraction for interconnection analysis", Custom Integrated Circuits Conference, 1995., Proceedings of the IEEE 1995, pp. 255-258.
Mujahid Muhammad, et al., "An ESD Design Automation Framework and Tool Flow for Nano-scale CMOS Technologies", Proc. EOS/ESD Symposium, pp. 2A.1-1-2A.1-6, 2010.

(Continued)

*Primary Examiner* — Naum B Levin

(57) ABSTRACT

Aspects of the invention relate to techniques for determining the electromigration features corresponding to layout design data. According to various examples of the invention, a circuit design is analyzed to determine voltages of nodes in an interconnect tree. From the voltages of the nodes, current density values and current directions for the segments of the interconnect tree are determined. Based on the current density values and the current directions, hydrostatic stress values for the nodes are computed under a steady-state condition and conservation of the conductive material within the interconnect tree. The electromigration susceptibility of the interconnect tree is then determined based on the computed hydrostatic stress values.

18 Claims, 8 Drawing Sheets

Flow chart
500

(56) References Cited

OTHER PUBLICATIONS

Syed M. Alam, Chee Lip Gan, Frank L. Wei, Carl V. Thompson, Donald E. Troxel, "Circuit-Level Reliability Requirements for Cu Metallization", Sep. 2005, Trans. IEEE Device and Materials Reliability, vol. 5, No. 3, pp. 522-531.

Syed M. Alarm, "Interconnect Reliability in Conventional and 3D Intergrated Circuts", UT Austin VLSI Seminar Series, 2004.

* cited by examiner

DETERMINATION OF ELECTROMIGRATION SUSCEPTIBILITY BASED ON HYDROSTATIC STRESS ANALYSIS

RELATED APPLICATIONS

This application is a continuation-in-part of U.S. Non-Provisional patent application Ser. No. 14/085,788, entitled "Determination Of Electromigration Features," filed on Nov. 20, 2013, and naming Patrick Gibson et al. as inventors, which application is incorporated entirely herein by reference.

FIELD OF THE INVENTION

The present invention is directed to circuit design analysis and verification. Various implementations of the invention may be useful for determining electromigration susceptibility.

BACKGROUND OF THE INVENTION

Electronic circuits, such as integrated microcircuits, are used in a variety of products, from automobiles to microwave ovens to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows for digital mircocircuit devices. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design.

The geometric elements define the shapes that will be created in various materials to actually manufacture the circuit device components (e.g., contacts, gates, etc.) making up the circuit. While the geometric elements are typically polygons, other shapes, such as circular and elliptical shapes, also may be employed. These geometric elements may be custom designed, selected from a library of previously-created designs, or some combination of both. Geometric elements also are added to form the connection lines that will interconnect these circuit devices.

With a layout design, each physical layer of the microcircuit will have a corresponding layer representation, and the geometric elements described in a layer representation will define the relative locations of the circuit device components that will make up a circuit device. Thus, the geometric elements in the representation of an implant layer will define the regions where doped material will be located, while the geometric elements in the representation of a metal layer will define the locations where conductive wires will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc.

After the layout design has been finalized, then it is converted into a format that can be employed by a mask or reticle writing tool to create a mask or reticle for use in a photolithographic manufacturing process. Examples of such formats are MEBES, for raster scanning machines manufactured by ETEC, an Applied Materials Company, the ".MIC" format from Micronics AB in Sweden, and various vector scan formats for Nuflare, JEOL, and Hitachi machines, such as VSB12 or VSB12. The written masks or reticles can then be used in a photolithographic process to expose selected areas of a wafer in order to produce the desired integrated circuit devices on the wafer.

One issue in particular that occurs with both digital and analog integrated circuits is electromigration. Electromigration is the gradual displacement of material caused by the movement of the ions which make up the lattice of a conductive material. The cause of electromigration is generally considered to be the momentum transfer from electrons traveling through the conductive material to ions that make up the lattice. A microcircuit device typically includes a dense array of narrow, thin-film metallic conductors that serve to transport current between various circuit elements of the microcircuit device. These metallic conductors are sometimes referred to as interconnects. Due to continuing miniaturization of microcircuit devices, interconnects are subject to increasingly high current densities. Under such conditions, electromigration can cause interconnects to fail electrically in short times and reduce the circuit lifetime to an unacceptable level. It is thus important to identify interconnects in a design that are susceptible to electromigration effects.

Conventional detection of interconnects at risk from electromigration uses techniques akin to finite element analysis, but these techniques are extremely resource intensive and are impractical for full-chip analysis. Alternate approaches determine the expected current density for an interconnect in a design (e.g., the current density that will be expected in the corresponding physical interconnect manufactured from the design). These techniques, however, typically determine whether the expected current density will cause the physical interconnect to fail quickly with use. They do not determine whether or not the physical interconnect will degrade over longer periods of time due to electromigration, or at what rate the degradation will occur.

BRIEF SUMMARY OF THE INVENTION

Aspects of the invention relate to techniques for determining the electromigration features corresponding to layout design data. According to various examples of the invention, a circuit design is analyzed to determine voltages of nodes in an interconnect tree. The interconnect tree comprises continuously connected geometric elements (i.e. connected interconnects) of a conductive material confined by diffusion blocking ends to one layer of a layout design for the circuit design. The nodes of an interconnect tree comprise locations where electron flows change directions, diverge, converge or reach diffusion blocking ends such as vias. The conductive material may be a metal material. The circuit design contains parasitic resistance information for the interconnect tree.

With some implementations of the invention, the analyzing comprises solving a matrix system constructed based on parasitic resistance values for the interconnect tree.

Based on the voltages of the nodes, current density values and current directions for segments of the interconnect tree are determined. Each of the segments being a part of the interconnect tree confined by a pair of neighboring nodes in the nodes.

Based on the current density values and the current directions, hydrostatic stress values for the nodes are computed under a state that assumes a steady-state condition, no voids being nucleated and conservation of the conductive material within the interconnect tree. The steady-state condition is a condition of no atomic fluxes in the interconnect tree.

The electromigration susceptibility of the interconnect tree is then determined based on the computed hydrostatic stress values. In some embodiments of the invention, the hydrostatic stress values are compared with one or two threshold values. The one or two threshold values may be a threshold value for tension stress, a threshold value for compression stress, or both. If at least one of the hydrostatic stress values is outside a range defined by the one or two threshold values, the interconnect tree is reported as being susceptible to electromigration effects. In some other embodiments of the invention, if one or more of the hydrostatic stress values are outside a range defined by the one or two threshold values, information of nodes or segments associated with the one or more of the hydrostatic stress values is reported. In still some other embodiments of the invention, the interconnect tree is reported as being immortal if none of the hydrostatic stress values is outside a range defined by the one or two threshold values.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION OF THE INVENTION

General Considerations

Figure 1:
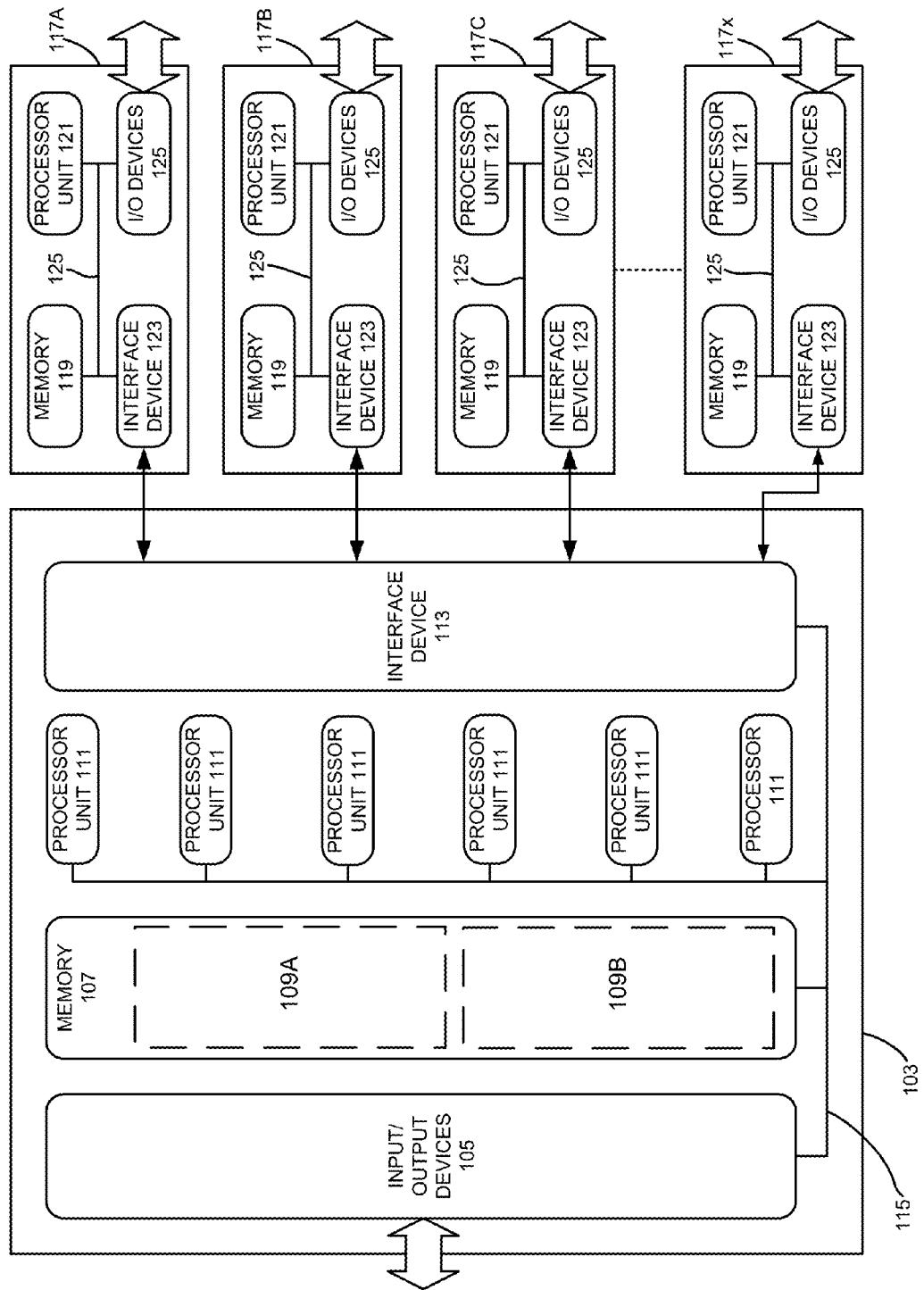
FIG. 1 illustrates an example of a computing system that may be used to implement various embodiments of the invention.

Various aspects of the present invention relate to techniques for determining electromigration susceptibility based on hydrostatic stress analysis. In the following description, numerous details are set forth for purpose of explanation. However, one of ordinary skill in the art will realize that the invention may be practiced without the use of these specific details. In other instances, well-known features have not been described in detail to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "analyze," "compute" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. The disclosed technology may also be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked, and includes both direct connections or direct links and indirect connections or indirect links through one or more intermediate elements not affecting the intended operation of the circuit.

Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
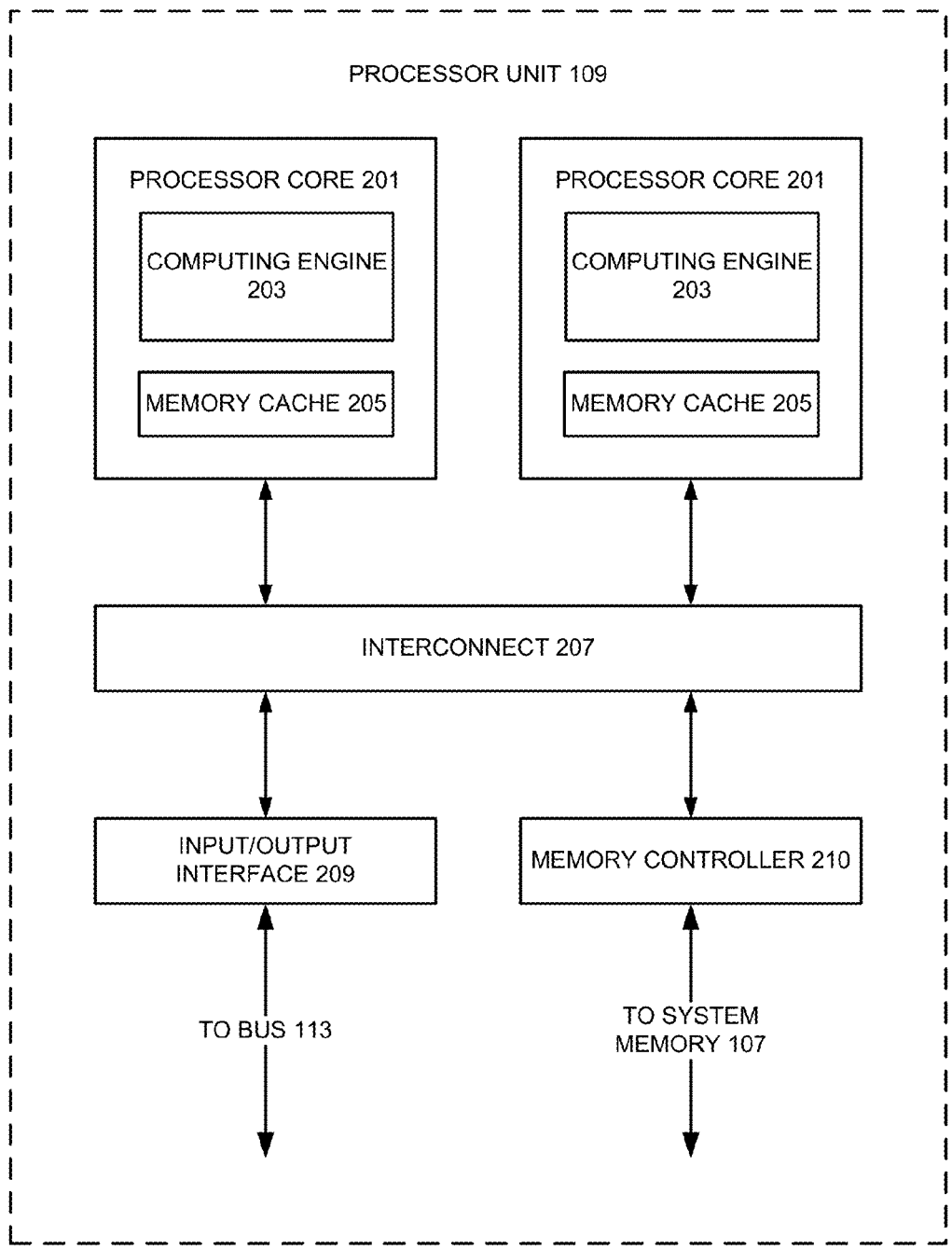
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify design data for manufacturing a microdevice, such as a microcircuit. As used herein, the terms "design" and "design data" are intended to encompass data describing an entire integrated circuit device. This term also is intended to encompass a smaller set of data describing one or more components of an entire integrated circuit device, however, such as a layer of an integrated circuit device, or even a portion of a layer of an integrated circuit device. Still further, the terms "design" and "design data" also are intended to encompass data describing more than one integrated circuit device, such as data to be used to create a mask or reticle for simultaneously forming multiple integrated circuit devices on a single wafer.

Figure 3:
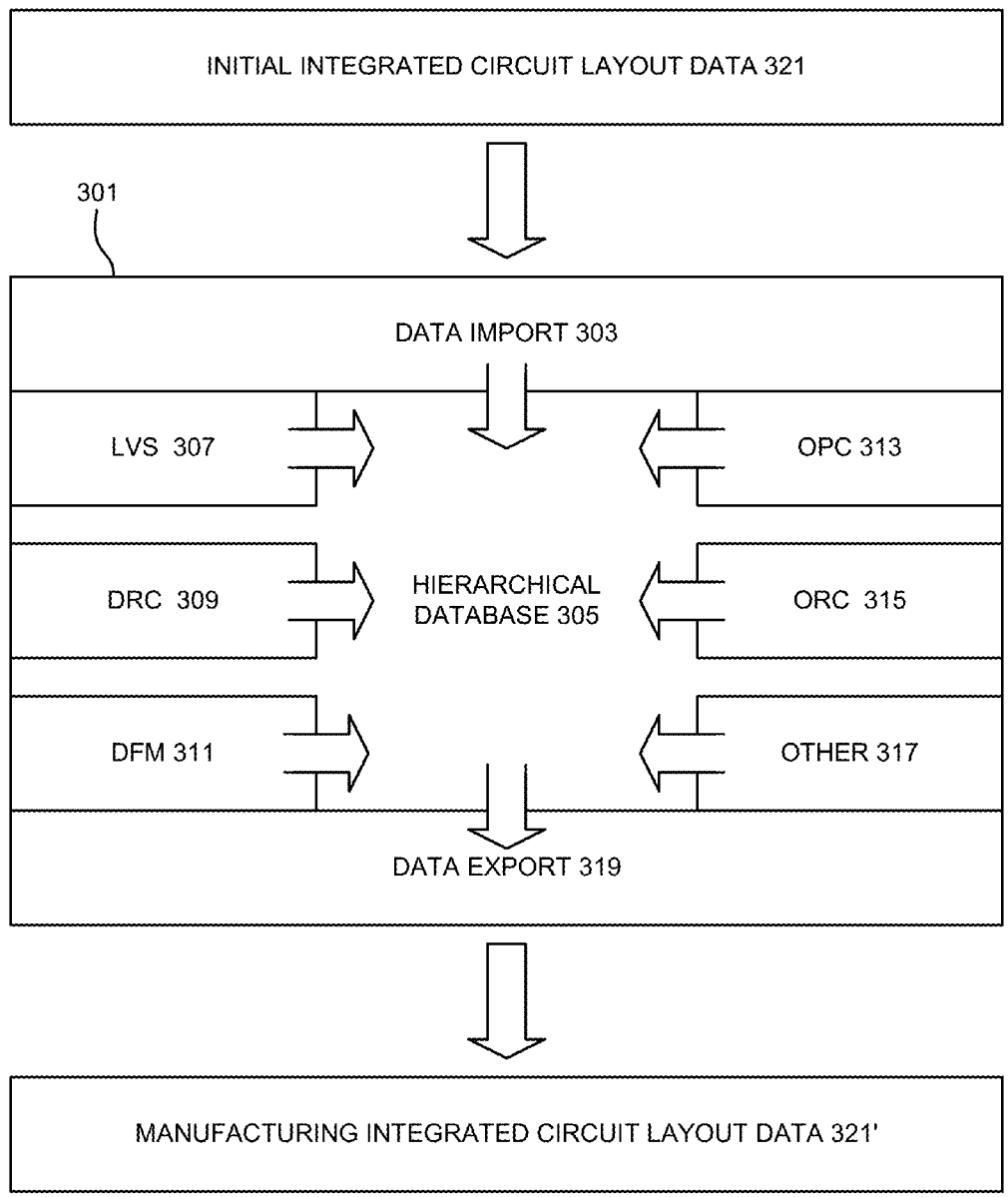
FIG. 3 schematically illustrates an example of a family of software tools for automatic design automation that may employ associative properties according to various embodiments of the invention.

To facilitate an understanding of various embodiments of the invention, one such software tool for automatic design automation, directed to the analysis and modification of a design for an integrated circuit, will now be generally described. As seen in FIG. 3, an analysis tool 301, which may be implemented using a variety of different software applications, includes a data import module 303 and a hierarchical database 305. The analysis tool 301 also includes a layout-versus-schematic (LVS) verification module 307, a design rule check (DRC) module 309, a design-for-manufacturing (DFM) module 311, an optical proximity correction (OPC) module 313, and an optical proximity rule check (ORC) module 315. The analysis tool 301 may further include other modules 317 for performing additional functions as desired, such as a phase shift mask (PSM) module (not shown), an etch simulation analysis module (not shown) and/or a planarization simulation analysis module (not shown). The tool 301 also has a data export module 319. One example of such an analysis tool is the Calibre® family of software applications available from Mentor Graphics® Corporation of Wilsonville, Oreg.

Initially, the tool 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics, Inc. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnect to the contact electrode. The initial integrated circuit layout data 321 may be converted by the data import module 303 into a format that can be more efficiently processed by the remaining components of the tool 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. According to various implementations of the invention tool 301, the layout data 321 may be manually revised by a user, automatically revised by the layout-versus-schematic module 307, or some combination thereof.

Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, with various implementations of the invention tool 301, the layout data 321 may be manually modified by a user, automatically modified by the design rule check module 309, or some combination thereof.

The modified layout data 321 is then processed by the design for manufacturing module 311. As previously noted, a "design-for-manufacture" processes attempts to identify elements in a design representing structures with a significant likelihood of being improperly formed during the manufacturing process. A "design-for-manufacture" process may additionally determine what impact the improper formation of the identified structures will have on the yield of devices manufactured from the circuit design, and/or modifications that will reduce the likelihood that the identified structures may be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules 317 may be employed to perform alternate or additional manipulations of the layout data 321, as desired. One such tool is a parasitic extraction tool, such as the Calibre® xRC™ parasitic extraction tool available from Mentor Graphics® Corporation of Wilsonville, Oreg. This parasitic extraction tool can be employed to precisely determine the expected electrical characteristics corresponding to geometric elements in layout design data, such as their expected resistance, expected inductance, and their expected capacitance. Accordingly, this tool is configured to partition geometric elements into portions, in order to precisely analyze the physical characteristics represented by the geometric elements. Further, it is configured to perform operations on the physical characteristics of those portions, such as the portion widths, the portion lengths, the physical properties of the materials represented by the geometric elements, etc.

After all of the desired operations have been performed on the initial layout data 321, the data export module 319 converts the processed layout data 321 into manufacturing integrated circuit layout data 323 that can be used to form one or more masks or reticules to manufacture the integrated circuit (that is, the data export module 319 converts the processed layout data 321 into a format that can be used in a photolithographic manufacturing process). Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool.

Accordingly, the data export module 319 may "fracture" larger geometric elements in the layout design, or geometric elements that are not right triangles, rectangles or trapezoids (which typically are a majority of the geometric elements in a layout design) into the smaller, more basic polygons that can be written by the mask or reticle writing tool. Of course, the data export module 319 may alternately or additionally convert the processed layout data 321 into any desired type of data, such as data for use in a synthesis process (e.g., for creating an entry for a circuit library), data for use in a place-and-route process, data for use in calculating parasitic effects, etc. Further, the tool 301 may store one or more versions of the layout 321 containing different modifications, so that a designer can undo undesirable modifications. For example, the hierarchical database 305 may store alternate versions of the layout data 321 created during any step of the process flow between the modules 307-317.

Data Organization

With various examples of the invention, layout design data may include two different types of data: "drawn layer" design data and "derived layer" design data. The drawn layer data describes geometric elements that will be used to form structures in layers of material to produce the integrated circuit. The drawn layer data will include geometric elements (usually polygons) that will be used to form structures in metal layers, diffusion layers, and polysilicon layers. The derived layers will then include features made up of combinations of drawn layer data and other derived layer data. Thus, with a transistor gate, derived layer design data describing the gate may be derived from the intersection of a geometric element in the polysilicon material layer and a geometric element in the diffusion material layer.

For example, a design rule check process performed by the design rule check module 309 typically will perform two types of operations: "check" operations that confirm whether design data values comply with specified parameters, and "derivation" operations that create derived layer data. A transistor gate design data thus may be created by the following derivation operation:

gate=diff AND poly

The results of this operation will be a "layer" of data identifying all intersections of diffusion layer geometric elements with polysilicon layer geometric elements. Likewise, a p-type transistor gate, formed by doping the diffusion layer with n-type material, is identified by the following derivation operation:

pgate=nwell AND gate

The results of this operation then will be another "layer" of data identifying all transistor gates (i.e., intersections of diffusion layer geometric elements with polysilicon layer geometric elements) where the geometric elements in the diffusion layer have been doped with n-type material.

A check operation performed by the design rule check module 309 will then define a parameter or a parameter range for a data design value. For example, a user may want to ensure that no metal wiring line is within a micron of another wiring line. This type of analysis may be performed by the following check operation:

external metal<1

The results of this operation will identify each geometric element in the metal layer design data that are closer than one micron to another geometric element in the metal layer design data.

Also, while the above operation employs drawn layer data, check operations may be performed on derived layer data as well. For example, if a user wanted to confirm that no transistor gate is located within one micron of another gate, the design rule check process might include the following check operation:

external gate<1

The results of this operation will identify all gate design data representing gates that are positioned less than one micron from another gate. It should be appreciated, however, that this check operation cannot be performed until a derivation operation identifying the gates from the drawn layer design data has been performed.

Electromigration and Hydrostatic Stress

As previously noted, electromigration is the gradual displacement of material caused by the momentum transfer from conducting electrons traveling through the material to metal ions in the material. The "electron wind" driving force creates a net flux of metal ions in the direction of the electron flow. As a result, there is a depletion of material "upstream" and an accumulation "downstream" at sites of flux divergence. This can lead to void formation and growth at points of material depletion causing a large increase in electrical resistance and, where there is material accumulation, to dielectric cracking and the formation of an extrusion resulting in a short between adjacent lines. Ultimately the circuit may fail.

Electromigration-induced material depletion and accumulation at the sites of ion flux divergence can lead to the development of localized tensile and compressive stresses, respectively. These mechanical stresses are referred to as hydrostatic stress. A backflow flux due to the resulting hydrostatic stress will be created, which opposes the electromigration flux. One effect of the hydrostatic stress is the so-called Blech length—the lower limit for the length of interconnect for a given current density that will be susceptible to electromigration. Any wire that has a length less than the Blech length will not fail from electromigtaion because the backflow flux of metal ions due to the hydrostatic stress compensates the electron wind-induced flow. Wires (interconnects) in this category are sometimes referred to as immortal wires (interconnects).

The hydrostatic stress may be utilized to identify interconnects susceptible to electromigration effects. After a sufficiently long time, a steady state of electromigration can be reached. In the steady state, the hydrostatic stress gradient force balances the electron wind force and the net atomic diffusion stops. A simple estimation of the hydrostatic stress gradient may be expressed as (assuming no voids occur):

$$\sigma_i^c - \sigma_j^a = \Delta\sigma_{ij} = -\frac{eZ\rho(j_{ij}L_{ij})}{\Omega} \quad (1)$$

where $\sigma_i^c$ and $\sigma_j^a$ are the hydrostatic stresses at the cathode (electron flow inlet) and anode (electron flow outlet) end of a segment of an interconnect, e is the electron charge, Z is the effective valence of migrating atoms, $\Omega$ is the atomic volume, $\rho$ is the electrical resistivity, $j_{ij}$ is the current density between i and j nodes, and $L_{ij}$ is the length of this sub-segment.

As a relative value, the hydrostatic stress gradient itself cannot serve as a direct indicator of the electromigration susceptibility. To determine whether an interconnect tree and/or even any of its segments may be susceptible to electromigration effects, the hydrostatic stress value for each node on the interconnect tree may be needed. Here, as previously noted, an interconnect tree comprises continuously connected geometric elements (i.e. connected interconnects) of a conductive material confined by diffusion blocking ends to one layer of a layout design for the circuit design; and nodes of an interconnect tree comprise locations where electron flows change directions, diverge, converge or reach diffusion blocking ends such as vias.

Hydrostatic-Stress-Based Electromigration Analysis Tool

Figure 4:
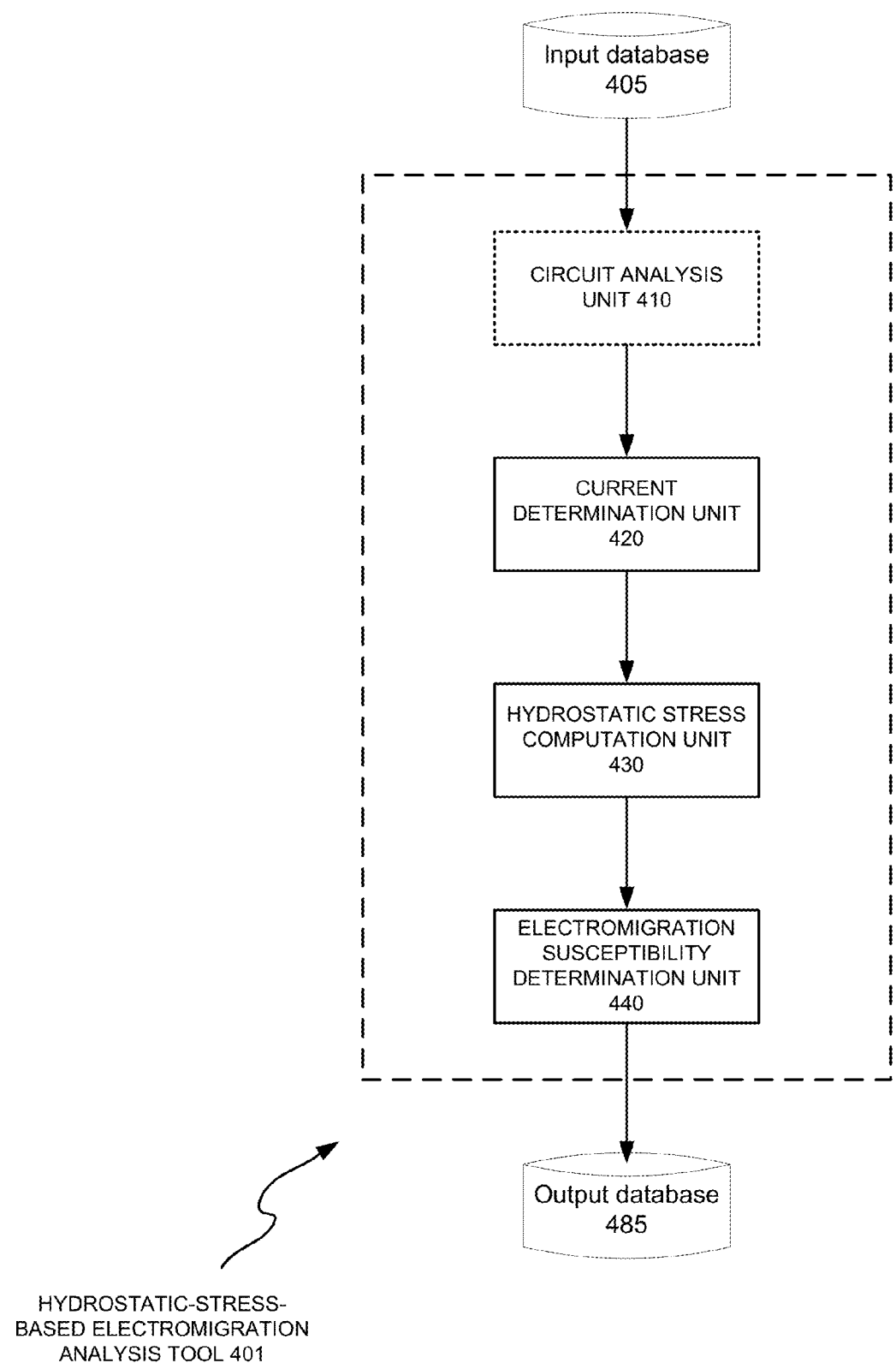
FIG. 4 illustrates a tool for determining electromigration susceptibility based on hydrostatic stress analysis according to various embodiments of the invention.

FIG. 4 illustrates a hydrostatic-stress-based electromigration analysis tool 401 for identifying interconnects in circuit designs susceptible to electromigration effects based on hydrostatic stress analysis according to various embodiments of the invention. As seen in this figure, the tool 401 includes a circuit analysis unit 410, a current determination unit 420, a hydrostatic stress computation unit 430 and a electromigration susceptibility determination unit 440. As seen in this figure, the hydrostatic-stress-based electromigration analysis tool 401 may work with an input database 405 and an output database 485.

As previously noted, various examples of the invention may be implemented by a multiprocessor computing system, such as the multiprocessor computing system 101 illustrated in FIG. 1. Accordingly, one or more components of each of the circuit analysis unit 410, the current determination unit 420, the hydrostatic stress computation unit 430 and the electromigration susceptibility determination unit 440 may be implemented by one or more processors in a multiprocessor computing system's master computer, such as the master computer 103, one or more servant computers in a multiprocessor computing system, such as the servant computers 117, or some combination of both executing the appropriate software instructions. Of course, still other embodiments of the invention may be implemented by, for example, one or more computer-readable storage devices having such software instructions stored thereon in a non-transitory manner, i.e., stored by a device over a period of time such that they may be retrieved at a single location in space for use at any arbitrary point during that period of time.

It also should be appreciated that, while the circuit analysis unit 410, the current determination unit 420, the hydrostatic stress computation unit 430 and the electromigration susceptibility determination unit 440 are shown as separate units in FIG. 4, a single servant computer (or a single processor within a master computer) may be used to implement two or more of these units at different times, or components of two or more of these units at different times.

With various examples of the invention, the input database 405 and the output database 485 may be implemented using any suitable computer readable storage device. That is, either of the input database 405 and the output database 485 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information.

As will be discussed in more detail below, the circuit analysis unit 410 analyzes a circuit design from the input database 405 to determine voltages of nodes in an interconnect tree. Based on the voltages of the nodes, the current determination unit 420 determines current density values and current directions for segments of the interconnect tree. The hydrostatic stress computation unit 430 then computes hydrostatic stress values for the nodes based on the current density values and the current directions. Finally, the electromigration susceptibility determination unit 440 determines electromigration susceptibility of the interconnect tree based on the hydrostatic stress values.

Electromigration Susceptibility Determination

Figure 5:
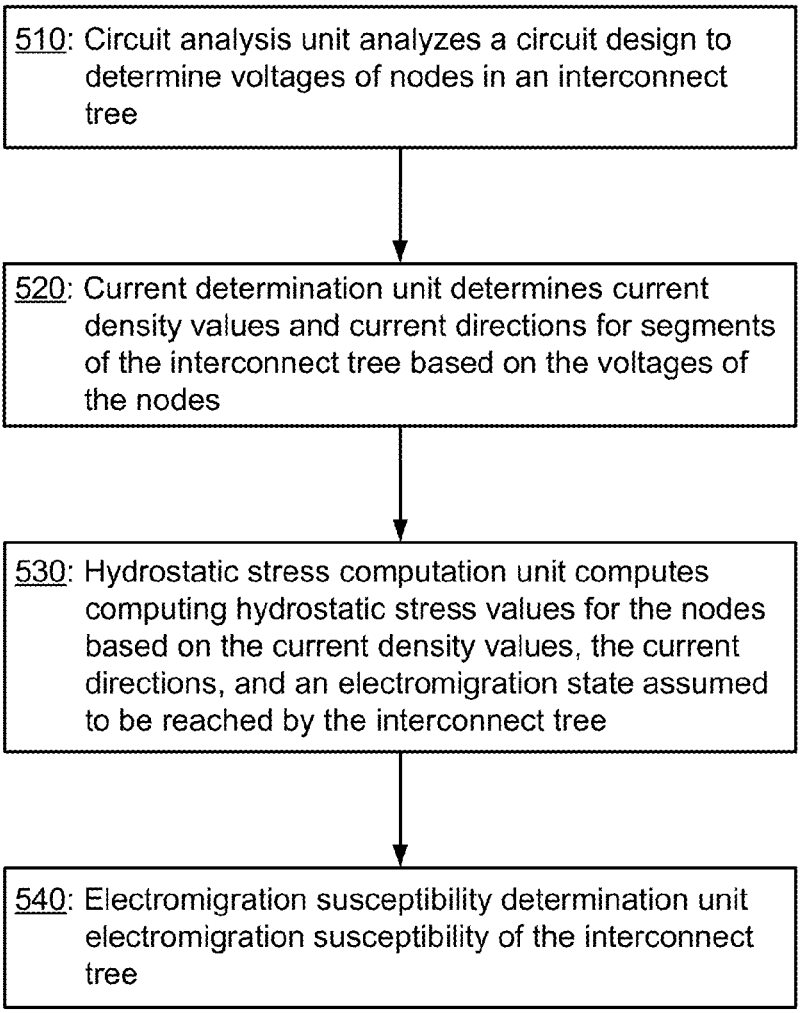
FIG. 5 illustrates a flowchart showing a process for determining electromigration susceptibility based on hydrostatic stress analysis that may be implemented according to various examples of the invention.

FIG. 5 illustrates a flowchart showing a process for determining electromigration susceptibility based on hydrostatic stress analysis that may be implemented according to various examples of the invention. While different variations of this process will be described with reference to the hydrostatic-stress-based electromigration analysis tool 401 shown in FIG. 4, it should be appreciated, however, that various methods for determining electromigration susceptibility based on hydrostatic stress analysis according to the present invention may be implemented without using the hydrostatic-stress-based electromigration analysis tool 401 shown in FIG. 4. Similarly, the hydrostatic-stress-based electromigration analysis tool 401 may be used to implement alternate methods for determining electromigration susceptibility based on hydrostatic stress analysis according to the present invention.

In operation 510, the circuit analysis unit 410 analyzes a circuit design to determine voltages of nodes in an interconnect tree. The interconnect tree comprises continuously connected geometric elements (i.e. connected interconnects) of a conductive material confined by diffusion blocking ends to one layer of a layout design for the circuit design. The nodes of an interconnect tree comprise locations where electron flows change directions, diverge, converge or reach diffusion blocking ends such as vias. The circuit design contains parasitic resistance information for the interconnect tree. The parasitic resistance information may be extracted from the layout design by a parasitic extraction tool, such as the Calibre® xRC™ parasitic extraction tool available from Mentor Graphics® Corporation of Wilsonville, Oreg. The conductive material may be a metal material.

The voltages of the nodes may be determined by employing a matrix solver. The matrix system to be solved may be constructed based on parasitic resistance values for the interconnect tree. Examples of matrix solvers that may be employed according to various examples of the invention include the SPICE matrix solvers, the KLU matrix solver designed by Timothy Davis at the University of Florida, and variations of these matrix solvers. (In this context, the term SPICE refers to all of the circuit simulators that are based on the same algorithms of the original UC Berkeley SPICE simulator.) The use and operation of these matrix solvers are well known in the art, and thus will not be discussed in further detail herein.

In operation 520, the current determination unit 420 determines current density values and current directions for segments of the interconnect tree based on the voltages of the nodes. Each of the segments is a part of the interconnect tree confined by a pair of neighboring nodes. The current direction for a segment can be derived from the voltages difference between two neighboring nodes associated with the segment. The current density for a segment can be calculated based on the voltage difference, the parasitic resistance and the cross section (or width) for the segment. The latter two may be extracted from the layout design and included in the circuit design database.

In operation 530, the hydrostatic stress computation unit 430 computes, based on the current density values and the current directions, hydrostatic stress values for the nodes under a state that assumes a steady-state condition, no voids being nucleated and conservation of the conductive material within the interconnect tree. The steady-state condition is a condition of no atomic fluxes in the interconnect tree. With the assumption of this steady-state condition and no voids being nucleated, the hydrostatic stress gradient can be computed according to Eq. (1). Eq. (1) has (k−1) equations, assuming the interconnect tree has k nodes. To solve for the hydrostatic stress values, one more equation is needed. This final equation may be obtained based on the conservation of the conductive material within the interconnect tree in addition to the steady-state and no-voids conditions:

$$\sum_{i,j=1}^{k} \left( \sigma_i - \left[ \sigma_T + \frac{eZ\rho(j_{ij}L_{ij})}{2\Omega} \right] \right) L_{ij} = 0 \quad (2)$$

where $\sigma_T$ is the thermal stress developed in the metal line confined in the ILD/IMD dielectric during cooling from the zero stress temperature down to the operating temperature. Here, i and j are not independent, but represent the labels of two neighboring nodes between which electrons flow from i to j.

Figure 6:
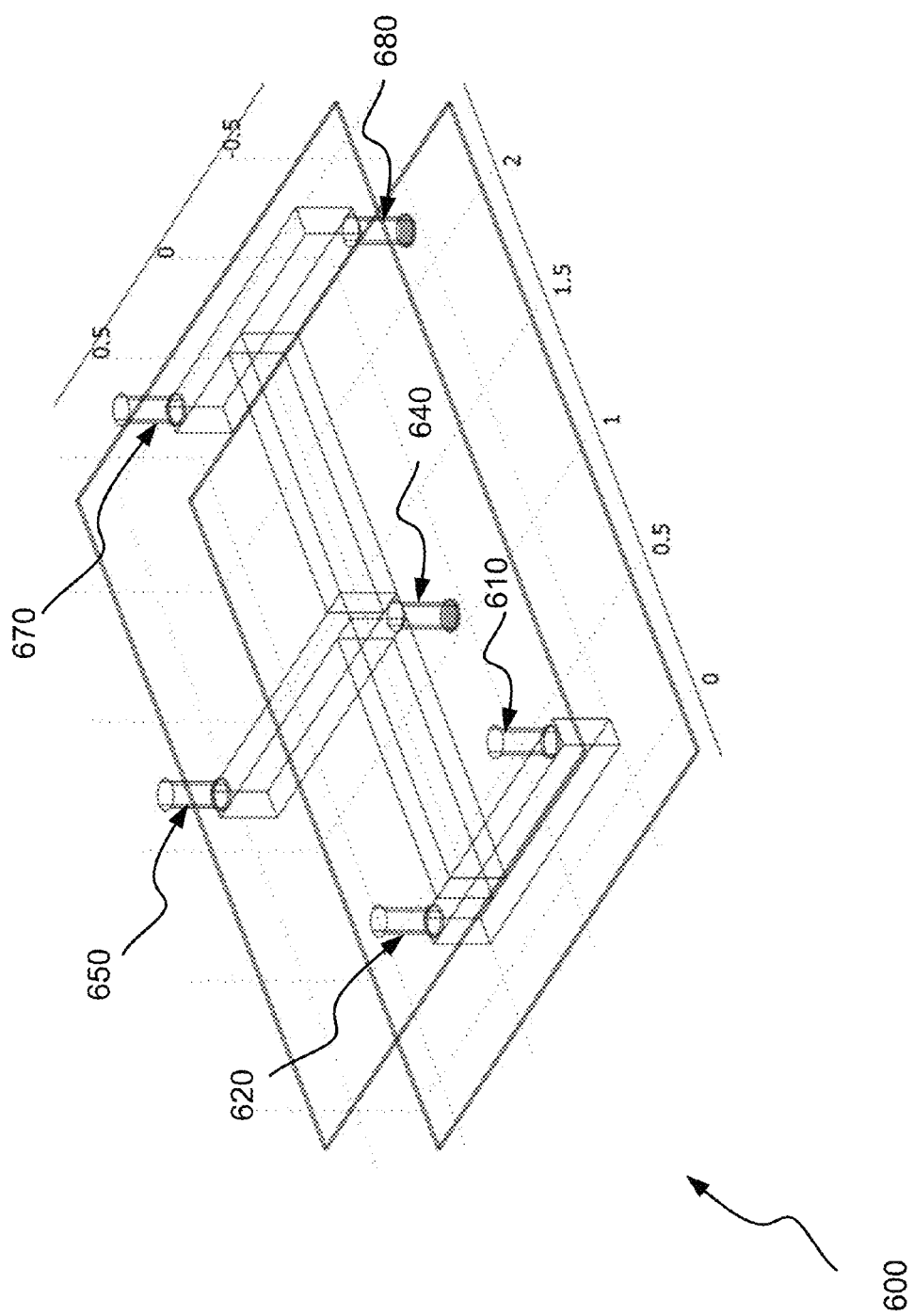
FIG. 6 illustrates an example of an interconnect tree 600.
Figure 7:
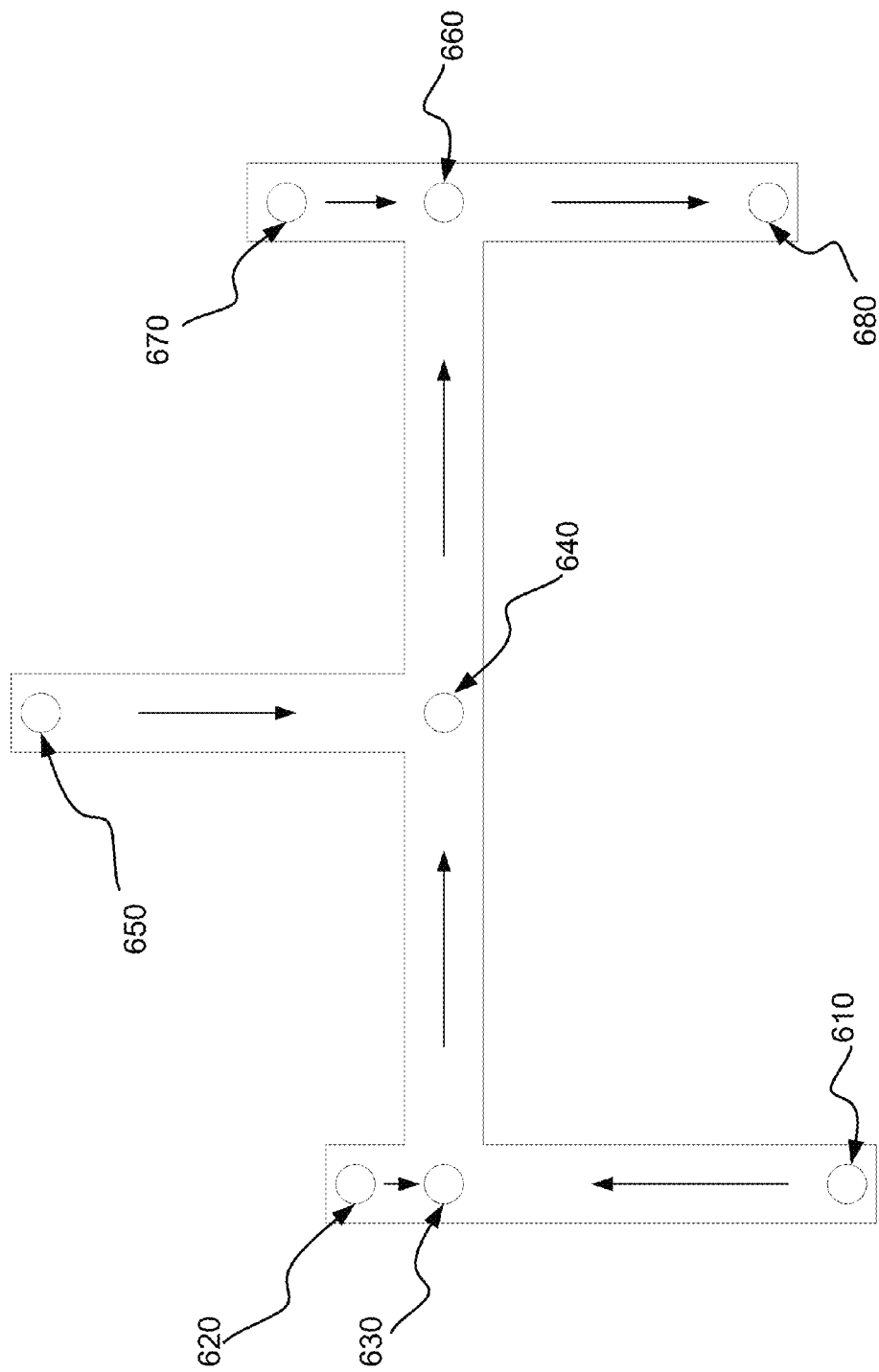
FIG. 7 illustrates a cross section view of the interconnect tree 600.

FIG. 6 illustrates an example of an interconnect tree 600. The interconnect tree 600 has six diffusion blocking ends, 610, 630, 640, 650, 670 and 680. Among them, 610, 630, 650 and 670 are inlets of electron flows while 640 and 680 are outlets of electron flows. These diffusion blocking ends may be, for example, vias. FIG. 7 illustrates a cross section view of the interconnect tree 600. The arrows inside the interconnect tree 600 represent directions of electron flows. The nodes 610-680 in the interconnect tree 600 include the six diffusion blocking ends and two electron flow converging points 640 and 660. These nodes partition the interconnect tree 600 into seven segments. The computed hydrostatic stress values, $\sigma_1$-$\sigma_8$ for the nodes 610-680, respectively, are depicted in FIG. 8.

In operation 540, the electromigration susceptibility determination unit 440 determines electromigration susceptibility of the interconnect tree based on the hydrostatic stress values. In some embodiments of the invention, the hydrostatic stress values are compared with one or two threshold values. The one or two threshold values may be a threshold value for tension stress, a threshold value for compression stress, or both. If at least one of the hydrostatic stress values is outside a range defined by the one or two threshold values, the interconnect tree is reported as being susceptible to electromigration effects. In some other embodiments of the invention, if one or more of the hydrostatic stress values are outside a range defined by the one or two threshold values, information of nodes or segments associated with the one or more of the hydrostatic stress values is reported. In still some other embodiments of the invention, the interconnect tree is reported as being immortal if none of the hydrostatic stress values is outside a range defined by the one or two threshold values.

Figure 8:
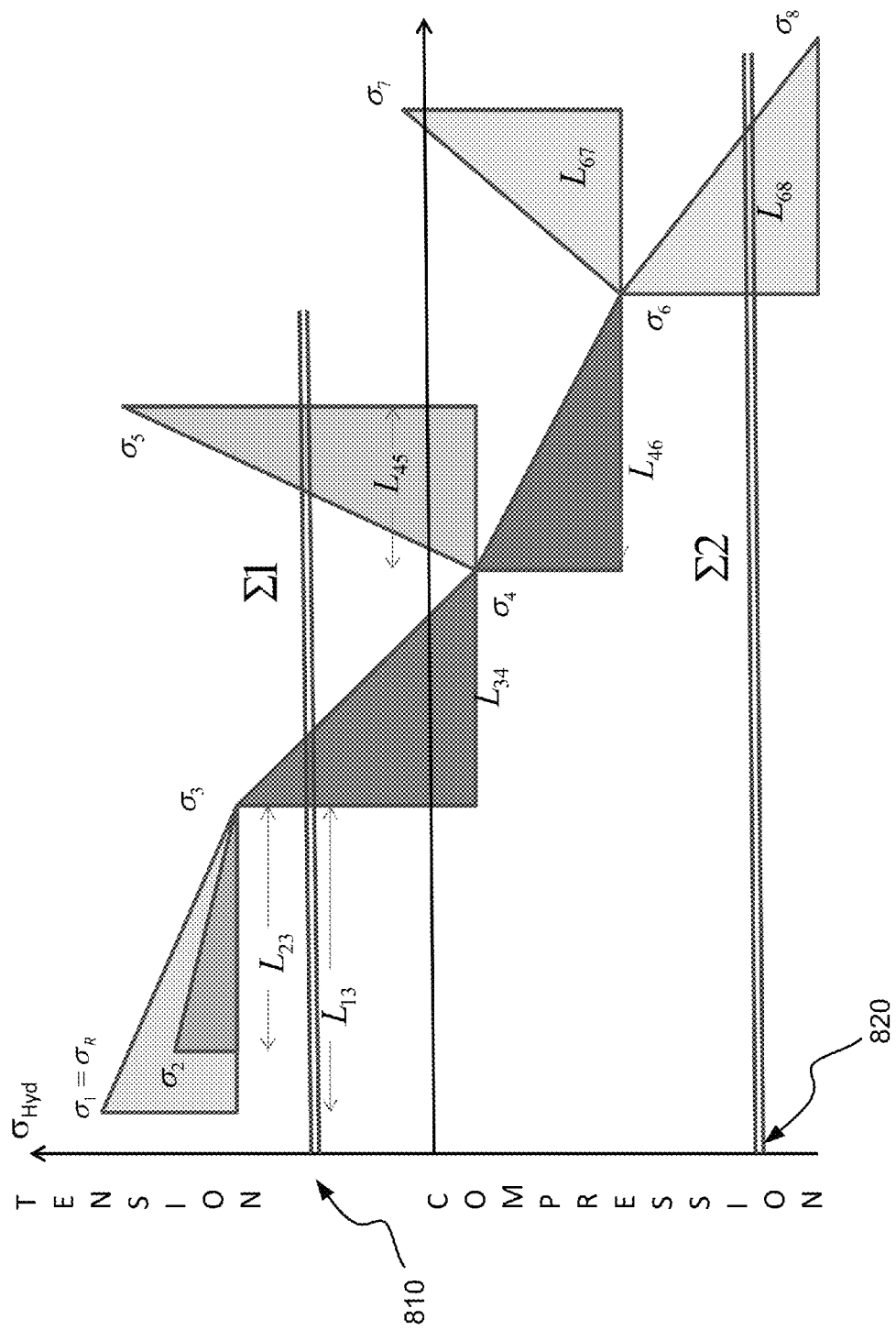
FIG. 8 illustrates computed hydrostatic stress values for the nodes and segments in the interconnect tree 600.

In the example shown in FIG. 8, double lines 810 indicate the position of a threshold value for tension stress and double lines 820 indicate the position of a threshold value for compression stress. As seen from the graph, the hydrostatic stress values for the nodes 610, 620, 630, 650 and 680 are outside a range defined by the two threshold values. Voids may form near the nodes 610, 620, 630 and 650 while a hillock may form near the node 680 if a chip with the circuit design operates for some time. Therefore, this interconnect tree or more specifically the segments associated with these nodes may be reported as being susceptible to electromigration effects.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes. The scope of the invention is defined by the following claims and their equivalents.

What is claimed is:

1. One or more processor-readable storage device storing computer-executable instructions for causing one or more processors to perform a method, the method comprising:

analyzing a circuit design to determine voltages of nodes in an interconnect tree, the interconnect tree comprising continuously connected geometric elements of a conductive material confined by diffusion blocking ends to one layer of a layout design for the circuit design, the nodes comprising locations where electron flows change directions, diverge, converge or reach diffusion blocking ends such as vias, the circuit design containing parasitic resistance information for the interconnect tree;

determining, based on the voltages of the nodes, current density values and current directions for segments of the interconnect tree, each of the segments being a part of the interconnect tree confined by a pair of neighboring nodes in the nodes;

computing, based on the current density values and the current directions, hydrostatic stress values for the nodes under a state that assumes a steady-state condition, no voids being nucleated and conservation of the conductive material within the interconnect tree, the steady-state condition being a condition of no atomic fluxes in the interconnect tree; and determining electromigration susceptibility of the interconnect tree based on the hydrostatic stress values.

2. The one or more processor-readable storage device recited in claim 1, wherein the determining comprises:

comparing the hydrostatic stress values with one or two threshold values;

reporting the interconnect tree as being susceptible to electromigration effects if at least one of the hydrostatic stress values is outside a range defined by the one or two threshold values.

3. The one or more processor-readable storage device recited in claim 1, wherein the determining comprises:

comparing the hydrostatic stress values with one or two threshold values;

reporting information of nodes or segments associated with one or more of the hydrostatic stress values if the one or more of the hydrostatic stress values are outside a range defined by the one or two threshold values.

4. The one or more processor-readable storage device recited in claim 1, wherein the analyzing comprises:

solving a matrix system constructed based on parasitic resistance values for the segments of the interconnect tree.

5. The one or more processor-readable storage device recited in claim 1, wherein the conductive material is a metal material.

6. The one or more processor-readable storage device recited in claim 1, wherein reporting the interconnect tree as being immortal if none of the hydrostatic stress values is outside a range defined by one or two threshold values.

7. A method, executed by at least one processor of a computer, comprising:

analyzing, using a computer, a circuit design to determine voltages of nodes in an interconnect tree, the interconnect tree comprising continuously connected geometric elements of a conductive material confined by diffusion blocking ends to one layer of a layout design for the circuit design, the nodes comprising locations where electron flows change directions, diverge, converge or reach diffusion blocking ends such as vias, the circuit design containing parasitic resistance information for the interconnect tree;

determining, based on the voltages of the nodes, current density values and current directions for segments of the interconnect tree, each of the segments being a part of the interconnect tree confined by a pair of neighboring nodes in the nodes;

computing, based on the current density values and the current directions, hydrostatic stress values for the nodes under a state that assumes a steady-state condition, no voids being nucleated and conservation of the conductive material within the interconnect tree, the steady-state condition being a condition of no atomic fluxes in the interconnect tree; and determining electromigration susceptibility of the interconnect tree based on the hydrostatic stress values.

8. The method recited in claim 7, wherein the determining comprises:

comparing the hydrostatic stress values with one or two threshold values;

reporting the interconnect tree as being susceptible to electromigration effects if at least one of the hydrostatic stress values is outside a range defined by the one or two threshold values.

9. The method recited in claim 7, wherein the determining comprises:

comparing the hydrostatic stress values with one or two threshold values;

reporting information of nodes or segments associated with one or more of the hydrostatic stress values if the one or more of the hydrostatic stress values are outside a range defined by the one or two threshold values.

10. The method recited in claim 7, wherein the analyzing comprises:

solving a matrix system constructed based on parasitic resistance values for the segments of the interconnect tree.

11. The method recited in claim 7, wherein the conductive material is a metal material.

12. The method recited in claim 7, wherein reporting the interconnect tree as being immortal if none of the hydrostatic stress values is outside a range defined by one or two threshold values.

13. A system comprising:

one or more processors, the one or more processors programmed to perform a method, the method comprising:

analyzing a circuit design to determine voltages of nodes in an interconnect tree, the interconnect tree comprising continuously connected geometric elements of a conductive material confined by diffusion blocking ends to one layer of a layout design for the circuit design, the nodes comprising locations where electron flows change directions, diverge, converge or reach diffusion blocking ends such as vias, the circuit design containing parasitic resistance information for the interconnect tree;

determining, based on the voltages of the nodes, current density values and current directions for segments of the interconnect tree, each of the segments being a part of the interconnect tree confined by a pair of neighboring nodes in the nodes;

computing, based on the current density values and the current directions, hydrostatic stress values for the nodes under a state that assumes a steady-state condition, no voids being nucleated and conservation of the conductive material within the interconnect tree, the steady-state condition being a condition of no atomic fluxes in the interconnect tree; and determining electromigration susceptibility of the interconnect tree based on the hydrostatic stress values.

14. The system recited in claim 13, wherein the determining comprises:

reporting the interconnect tree as being susceptible to electromigration effects if at least one of the hydrostatic stress values is greater than a threshold value.

15. The system recited in claim 13, wherein the determining comprises:

if one or more of the hydrostatic stress values are greater than a threshold value, reporting information of nodes or segments associated with the one or more of the hydrostatic stress values.

16. The system recited in claim 13, wherein the analyzing comprises:

solving a matrix system constructed based on parasitic resistance values for the segments of the interconnect tree.

17. The system recited in claim 13, wherein the conductive material is a metal material.

18. The system recited in claim 13, wherein reporting the interconnect tree as being immortal if none of the hydrostatic stress values is outside a range defined by one or two threshold values.

* * * * *